United States Patent
Zhang

(10) Patent No.: US 12,406,703 B2
(45) Date of Patent: Sep. 2, 2025

(54) STRUCTURE FOR DATA TRANSMISSION, METHOD FOR DATA TRANSMISSION, AND MEMORY

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 331 days.

(21) Appl. No.: 18/154,935

(22) Filed: Jan. 16, 2023

(65) Prior Publication Data

US 2024/0013820 A1 Jan. 11, 2024

Related U.S. Application Data

(63) Continuation of application No. PCT/CN2022/109286, filed on Jul. 30, 2022.

(30) Foreign Application Priority Data

Jul. 5, 2022 (CN) .......................... 202210794020.5

(51) Int. Cl.
G11C 7/10 (2006.01)
G11C 5/14 (2006.01)

(52) U.S. Cl.
CPC ............ G11C 7/109 (2013.01); G11C 5/14 (2013.01); G11C 7/1087 (2013.01)

(58) Field of Classification Search
CPC .......... G11C 5/14; G11C 7/109; G11C 7/1087
See application file for complete search history.

(56) References Cited

U.S. PATENT DOCUMENTS

| | | | |
|---|---|---|---|
| 9,509,285 B1* | 11/2016 | Paul | H03K 3/356104 |
| 2003/0151953 A1* | 8/2003 | Macri | G11C 7/1006 365/230.01 |
| 2004/0113673 A1* | 6/2004 | Lee | H03K 3/012 327/218 |
| 2022/0103175 A1* | 3/2022 | Hsu | H03K 3/356182 |

* cited by examiner

Primary Examiner — Sung Il Cho
(74) Attorney, Agent, or Firm — Syncoda LLC; Feng Ma

(57) ABSTRACT

A structure for data transmission, a method for data transmission, and a memory are provided. The structure for data transmission includes: a data transmission circuit configured to generate second data in response to a flip control signal and first data; and a control circuit configured to generate the flip control signal in response to the enabling control signal and the second data. When the second data of a previous bit is the same as the first data of the current bit, the flip control signal and the first data are used for turning off the data transmission circuit, and the second data of the current bit is generated according to the second data of a previous bit.

16 Claims, 9 Drawing Sheets

STRUCTURE FOR DATA TRANSMISSION, METHOD FOR DATA TRANSMISSION, AND MEMORY

CROSS-REFERENCE TO RELATED APPLICATION

The present disclosure is a US continuation application of International Application No. PCT/CN2022/109286, filed on Jul. 30, 2022, which claims priority to Chinese patent application No. 202210794020.5, filed on Jul. 5, 2022 and entitled "STRUCTURE FOR DATA TRANSMISSION, METHOD FOR DATA TRANSMISSION, AND MEMORY". The disclosures of International Application No. PCT/CN2022/109286 and Chinese patent application No. 202210794020.5 are hereby incorporated by reference in their entireties.

BACKGROUND

Dynamic Random Access Memory (DRAM) is widely used in modern electronic systems due to high storage density and high transmission speed thereof. With the development of semiconductor technology, DRAM technology is more and more advanced, and the integration of memory cells is higher and higher. At the same time, various applications require higher and higher performance, power consumption and reliability of the DRAM.

The length of a memory bus is large, so in order to prevent the attenuation of data in the process of bus transmission, it is necessary to arrange a driver on the bus to compensate the data transmitted by the bus. For the data in the process of bus transmission, if the state of the current data is inconsistent with the state of the previous data, the bus data may flip. If the state of the current data is the same as the state of the previous data, although the bus data does not flip, a control signal of a control transistor in the driver may flip.

When the bus data does not flip, the flip of the control signal of a control transistor in the driver may lead to invalid current consumption in the memory, resulting in meaningless power loss. In addition, since the power consumption of the driver is relatively large, the amount of bus transmission data processed by the driver is very large, resulting in a large loss of power consumption of the memory.

SUMMARY

The disclosure relates to the field of semiconductor circuit design, and in particular to a structure for data transmission, a method for data transmission and a memory.

An embodiment of the disclosure provides a structure for data transmission. A data transmission circuit used for receiving first data and a flip control signal is configured to generate second data in response to the flip control signal and the first data. A control circuit used for receiving the second data and an enabling control signal is configured to generate the flip control signal in response to the enabling control signal and the second data. The enabling control signal is used for enabling the data transmission circuit to transmit data. When the second data of a previous bit is the same as the first data of the current bit, the flip control signal and the first data are used for turning off the data transmission circuit, and the second data of the current bit is generated according to the second data of a previous bit. When the second data of the previous bit is different from the first data of the current bit, the flip control signal and the first data are used for turning on the data transmission circuit, and the second data of the current bit is generated according to the first data of the current bit.

Another embodiment of the disclosure provides a method for data transmission, which is applied to the method for data transmission provided by the above embodiment, including that: a flip control signal is generated based on the value of second data of a previous bit and an enabling control signal; it is judged whether the value of first data of a current bit needs to be transmitted to adjust the value of the second data based on the value of the second data of the previous bit and the value of the first data of the current bit; and based on the result of the judgment, second data is generated in response to the flip control signal and the value of the first data of the current bit.

Yet another embodiment of the disclosure also provides a memory, which employs the structure for data transmission provided by the above embodiment for data transmission.

BRIEF DESCRIPTION OF THE DRAWINGS

One or more embodiments are exemplified by the pictures in the corresponding drawings. These exemplary descriptions do not constitute a limitation on the embodiments. Unless otherwise stated, the figures in the drawings do not constitute a proportion limit. In order to describe the technical solutions in the embodiments of the disclosure or in the related art more clearly, the drawings required to be used in descriptions about the embodiments or the related art will be simply introduced below, obviously, the drawings described below are some embodiments of the disclosure, and other drawings may further be obtained by those of ordinary skill in the art according to the drawings without creative work.

DETAILED DESCRIPTION

It is to be learned from a background art that the length of a memory bus is large, so in order to prevent the attenuation of data in the process of bus transmission, it is necessary to arrange a driver on the bus to compensate the data transmitted by the bus. In the process of data bus transmission, if the state of the current data is inconsistent with the state of the previous data, the bus data may flip. If the state of the current data is the same as the state of the previous data, although the bus data does not flip, a control signal of a control transistor in the driver may flip. When the bus data does not flip, the flip of the control signal of a control transistor in the driver may lead to invalid current consumption in the memory, resulting in meaningless power loss. In addition, since the power consumption of the driver is relatively large, the amount of bus transmission data processed by the driver is very large, resulting in a large loss of power consumption of the memory.

An embodiment of the disclosure provides a structure for data transmission, which prevents a control signal of a control transistor in a driver from ineffective flipping when bus data does not flip, thereby avoiding ineffective current consumption in a memory and reducing the power consumption of the memory.

It is to be understood by those of ordinary skill in the art that in the various embodiments of the disclosure, many technical details have been proposed in order to make a reader better understand the disclosure. However, even without these technical details and various variations and modifications based on the following embodiments, the technical solutions claimed in the disclosure may also be implemented. The following embodiments are divided for convenience of description, and shall not constitute any limitation on the specific implementation mode of the disclosure. The embodiments may be combined with each other and quoted from each other on the premise of no contradiction.

Figure 1:
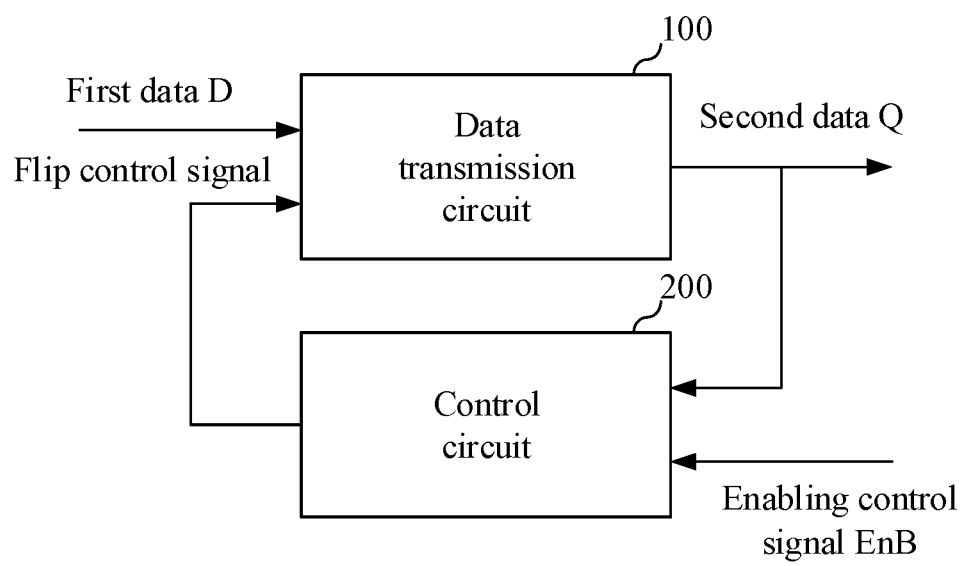
FIG. 1 is a schematic structural diagram of a structure for data transmission according to an embodiment of the disclosure.
Figure 2:
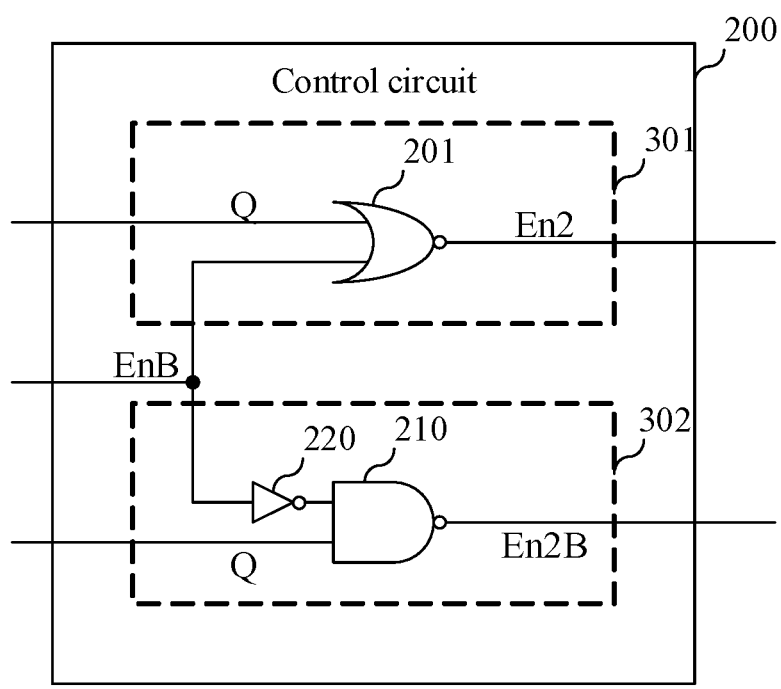
FIG. 2 is a schematic structural diagram of a control circuit according to an embodiment of the disclosure.
Figure 3:
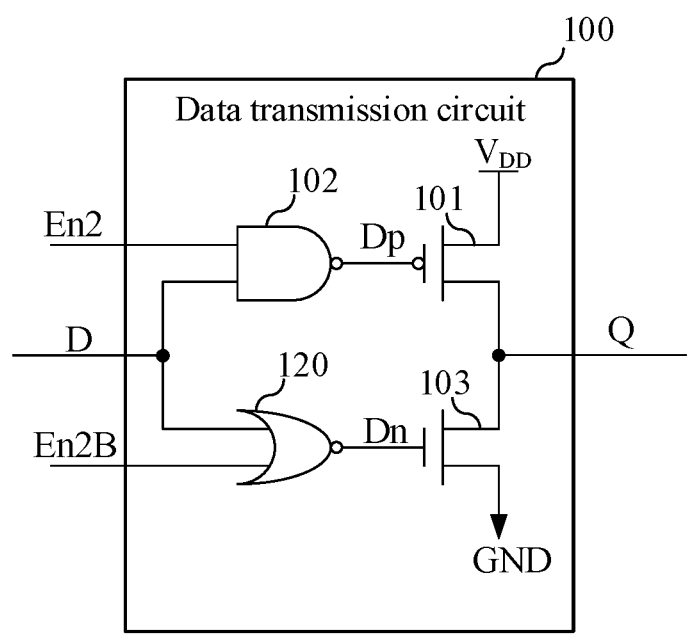
FIG. 3 is a schematic structural diagram of a data transmission circuit according to an embodiment of the disclosure.
Figure 4:
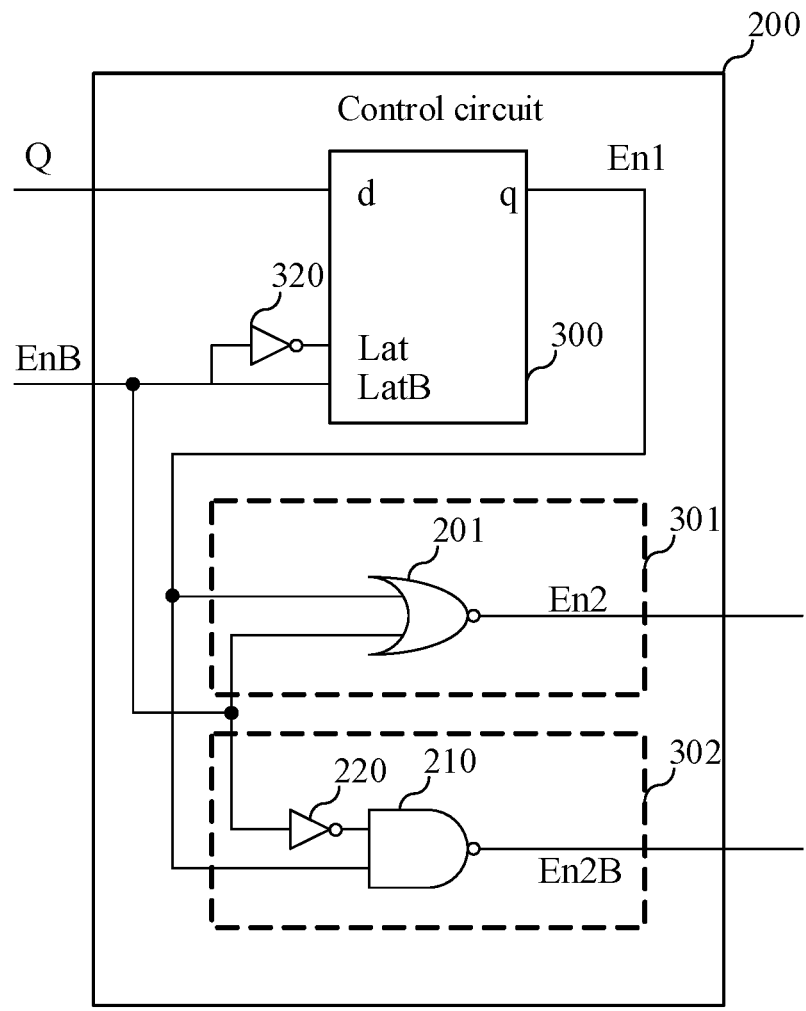
FIG. 4 is a schematic structural diagram of a control circuit with a data sampler according to an embodiment of the disclosure.

FIG. 1 is a schematic structural diagram of a structure for data transmission according to an embodiment of the disclosure. FIG. 2 is a schematic structural diagram of a control circuit according to an embodiment of the disclosure. FIG. 3 is a schematic structural diagram of a data transmission circuit according to an embodiment of the disclosure. FIG. 4 is a schematic structural diagram of a control circuit with a data sampler according to an embodiment of the disclosure. FIGS. 5-8 are schematic diagrams of signal timing change of a structure for data transmission according to an embodiment of the disclosure. The structure for data transmission provided in the embodiment is described in detail below with reference to the drawings.

Referring to FIG. 1, the structure for data transmission includes: a data transmission circuit 100 and a control circuit 200.

The data transmission circuit 100 used for receiving first data D and a flip control signal is configured to generate second data Q in response to the flip control signal and the first data D.

The control circuit 200 used for receiving the second data Q and an enabling control signal EnB is configured to generate the flip control signal in response to the enabling control signal EnB and the second data Q.

Herein, the first data D is the data before transmission, the second data Q is the data after transmission, and the flip control signal is the control signal of a control transistor in the driver. The enabling control signal EnB is used for enabling the data transmission circuit 100 to transmit data. Specifically, the enabling control signal EnB controls, by generating the flip control signal, the data transmission circuit 100 to generate the second data Q based on the first data D.

When the second data Q of a previous bit is the same as the first data D of the current bit, the flip control signal and the first data D are used for turning off the data transmission circuit 100, and the second data Q of the current bit is generated according to the second data of the previous bit. When the second data Q of the previous bit is different from the first data D of the current bit, the flip control signal and the first data are used for turning on the data transmission circuit 100, and the second data Q of the current bit is generated according to the first data of the current bit.

According to the structure for data transmission provided in the embodiment, the flip control signal is generated based on the second data Q of the previous bit. That is, the flip control signal contains information of the second data Q of the previous bit. The data transmission circuit 100 controls the turn-on or turn-off based on the flip control signal and the first data D of the current bit, which is equivalent to adding a process of judging whether the first data D of the current bit is the same as the second data Q of previous bit. When the first data D of the current bit is the same as the second data Q of the previous bit, the data transmission circuit 100 is directly turned off, that is, the driver in the bus is turned off, so as to avoid the control signal of a control transistor in the driver from ineffective flipping, and accordingly avoid ineffective current consumption in the memory so as to reduce the power consumption of the memory.

Specifically, referring to FIG. 2, in some embodiments, the flip control signal includes a first control signal En2 and a second control signal En2B. The control circuit 200 includes: a first control sub-circuit 301 configured to generate the first control signal En2 based on the second data Q and the enabling control signal EnB, and a second control sub-circuit 302 configured to generate the second control signal En2B based on the second data Q and the enabling control signal EnB. When the enabling control signal EnB is an effective signal, the generated first control signal En2 and the generated second control signal En2B are mutually inverted signals. Herein, one of the first control signal En2 and the second control signal En2B is used as the control signal of a P-type transistor in the driver, and the other is used as the control signal of an N-type transistor in the driver.

It is to be noted that in the embodiment and subsequent description, detailed description is made by taking the first control signal En2 as the control signal of the P-type transistor in the driver and the second control signal En2B as the control signal of the N-type transistor in the driver as an example, which does not constitute a limitation to the embodiment. In other embodiments, the first control signal En2 may be used as the control signal of the N-type transistor in the driver, and the second control signal En2B may be used as the control signal of the P-type transistor in the driver.

Referring to FIG. 2, in an example, the first control sub-circuit 301 includes: a first NOR gate 201 with an input end used for receiving the second data Q, the other input end used for receiving the enabling control signal EnB, and an output end used for outputting the first control signal En2.

Continuing to refer to FIG. 2, in an example, the second control sub-circuit 302 includes: a first NAND gate 210 with an input end used for receiving the second data Q, the other input end connected to an output end of a first inverter 220, and an output end used for outputting the second control signal En2B. An input end of the first inverter 220 is used for receiving the enabling control signal EnB.

Since there is a delay between an input signal and an output signal of each component, assuming that the first data D of the previous bit appears at time t1, accordingly, the second data Q of the previous bit generated by the first data D of the previous bit may appear at time t2 after a certain delay, the first control signal En2 and the second control signal En2B generated based on the second data Q of the previous bit and the enabling control signal EnB may appear at time t3 after a certain delay, and the second data Q of the current bit generated based on the first control signal En2, the second control signal En2B and the first data D of the current bit may appear at time t4 after a certain delay. Based on the above discussion, it is to be learned that the first data D of the previous bit appears at time t1, the second data of the previous bit appears at time t2, the first data D of the current bit appears between time t3 and time t4, and the second data of the current bit appears at time t4, which is in line with the data transmission timing of the memory.

Referring to FIG. 3, in some embodiments, the data transmission circuit 100 includes: a second NAND gate 102 with an input end used for receiving the first data D and the other input end used for receiving the first control signal En2; a second NOR gate 120 with an input end used for receiving the first data D and the other input end used for receiving the second control signal En2B; a P-type transistor 101 with a gate connected to an output end of the second NAND gate 102, a source coupled with a power supply voltage VDD, and a drain used for outputting the second data Q; and an N-type transistor 103 with a gate connected to an output end of the second NOR gate 120, a source grounded to GND, and a drain connected to the drain of the P-type transistor 101.

Specifically, the second NAND gate 102 generates a P-transistor control signal Dp according to the first data D and the first control signal En2, and the P-transistor control signal Dp is used for controlling the turn-on or turn-off of the P-type transistor 101. The second NOR gate 120 generates an N-transistor control signal Dn according to the first data D and the second control signal En2B, and the N-transistor control signal Dn is used for controlling the turn-on or turn-off of the N-type transistor 103.

Based on the structure for data transmission described in FIGS. 1 to 3, a truth table of the first data D, the second data Q, the enabling control signal EnB, the first control signal Ent, the second control signal En2B, the P-transistor control signal Dp and the N-transistor control signal Dn is as follows.

When the enabling control signal EnB is 1, En2 is generated by the first NOR gate 201 according to the enabling control signal EnB and the third data En1, that is, En2 is a NOR value of 1 and 0, taking 0. En2B is generated by the first NAND gate 210 according to an inverted signal of the enabling control signal EnB and the second data Q of the previous bit, that is, En2B is a NAND value of 0 and 0, taking 1. Dp is generated by the second NAND gate 202 according to the first control signal En2 and the first data D of the current bit, that is, Dp is the NAND value of 0 and 0, taking 1. Dn is generated by the second NOR gate 220 according to the second control signal En2B and the first data D of the current bit, that is, Dn is a NOR value of 1 and 0, taking 0. It is to be learned that when the enabling control signal EnB is equal to 1, Dp=1, Dn=0, and both the P-type transistor 101 and the N-type transistor are turned off.

When the enabling control signal EnB is 0, En2 is generated by the first NOR gate 201 according to the enabling control signal EnB and the second data Q of the previous bit, that is, En2 is a NOR value of 0 and 0, taking 1. En2B is generated by the first NAND gate 210 according to an inverted signal of the enabling control signal EnB and the second data Q of the previous bit, that is, En2B is a NAND value of 1 and 0, taking 1. Dp is generated by the second NAND gate 202 according to the first control signal En2 and the first data D of the current bit, that is, Dp is the NAND value of 1 and 0, taking 1. Dn is generated by the second NOR gate 220 according to the second control signal En2B and the first data D of the current bit, that is, Dn is a NOR value of 1 and 0, taking 0. It is to be learned that when the enabling control signal EnB is equal to 0, Dp=1, Dn=0, and both the P-type transistor 101 and the N-type transistor are turned off.

TABLE 1

Truth Table corresponding to various data of the structure for data transmission in the embodiment

| D | Q | EnB | En2 | En2B | Dp | Dn | Working condition of the data transmission circuit 100 |
|---|---|---|---|---|---|---|---|
| 0 | 0 | 1 | 0 | 1 | 1 | 0 | The data transmission circuit 100 is turned off and Q is kept. |
| 0 | 0 | 0 | 1 | 1 | 1 | 0 | The data transmission circuit 100 is turned off and Q is kept. |
| 0 | 1 | 1 | 0 | 1 | 1 | 0 | The data transmission circuit 100 is turned off and Q is kept. |
| 0 | 1 | 0 | 0 | 0 | 1 | 1 | The data transmission circuit 100 is turned on and Q flips. |
| 1 | 0 | 1 | 0 | 1 | 1 | 0 | The data transmission circuit 100 is turned off and Q is kept. |
| 1 | 0 | 0 | 1 | 1 | 0 | 0 | The data transmission circuit 100 is turned on and Q flips. |
| 1 | 1 | 1 | 0 | 1 | 1 | 0 | The data transmission circuit 100 is turned off and Q is kept. |
| 1 | 1 | 0 | 0 | 0 | 1 | 0 | The data transmission circuit 100 is turned off and Q is kept. |

It is to be noted that the design in Table 1 takes the enabling control circuit 200 when the enabling control signal EnB is equal to 0 as an example to make detailed description, which is only for those skilled in the art to understand the implementation of the scheme, and does not constitute a limitation to the embodiment. In other embodiments, an enabling control circuit when the enabling control signal is equal to 1 may also be designed. With reference to the contents of Table 1 and FIG. 3, it is to be learned that the structure for data transmission includes four working conditions, which are specifically as follows:

(1) The case when the second data Q of the previous bit is 0 and the first data D of the current bit is 0.

In conclusion, in the working condition (1), regardless of whether the enabling control signal EnB is 1 or 0, the P-transistor control signal Dp generated by the second NAND gate 102 remains unchanged at 1, and the N-transistor control signal Dn generated by the second NOR gate 120 remains unchanged at 0. The data transmission circuit 100 is turned off, and the second data Q of the current bit remains unchanged, that is, the second data Q does not flip. The P-transistor control signal Dp generated by the second NAND gate 102 and the N-transistor control signal Dn generated by the second NOR gate 120 are kept unchanged, so as to avoid ineffective flipping of the control signal of a control transistor in the driver from causing the change of the working condition of the control transistor, thereby reducing the power consumption of the memory.

(2) The case when the second data Q of the previous bit is 1 and the first data D of the current bit is 0.

When the enabling control signal EnB is 1, En2 is generated by the first NOR gate 201 according to the enabling control signal EnB and the second data Q of the previous bit, that is, En2 is a NOR value of 1 and 1, taking 0. En2B is generated by the first NAND gate 210 according to an inverted signal of the enabling control signal EnB and the second data Q of the previous bit, that is, En2B is a NAND value of 0 and 1, taking 1. Dp is generated by the second NAND gate 202 according to the first control signal En2 and the first data D of the current bit, that is, Dp is the NAND value of 0 and 0, taking 1. Dn is generated by the second NOR gate 220 according to the second control signal En2B and the first data D of the current bit, that is, Dn is a NOR value of 1 and 0, taking 0. It is to be learned that when the enabling control signal EnB is equal to 1, Dp=1, Dn=0, and both the P-type transistor 101 and the N-type transistor are turned off.

When the enabling control signal EnB is 0, En2 is generated by the first NOR gate 201 according to the enabling control signal EnB and the second data Q of the previous bit, that is, En2 is a NOR value of 0 and 1, taking 0. En2B is generated by the first NAND gate 210 according to an inverted signal of the enabling control signal EnB and the second data Q of the previous bit, that is, En2B is a NAND value of 1 and 1, taking 0. Dp is generated by the second NAND gate 202 according to the first control signal En2 and the first data D of the current bit, that is, Dp is the NAND value of 0 and 0, taking 1. Dn is generated by the second NOR gate 220 according to the second control signal En2B and the first data D of the current bit, that is, Dn is a NOR value of 0 and 0, taking 1. It is to be learned that when the enabling control signal EnB is equal to 0, Dp=1, Dn=0, and the P-type transistor 101 is turned off and the N-type transistor are turned on.

In conclusion, in the working condition (2), the enabling control signal EnB is 1, the P-transistor control signal Dp generated by the second NAND gate 102 remains unchanged at 1, the N-transistor control signal Dn generated by the second NOR gate 120 remains unchanged at 0, the data transmission circuit 100 is turned off, and the second data Q of the current bit remains unchanged. The enabling control signal EnB is 0, the P-transistor control signal Dp is 1, the N-transistor control signal Dn is 1, the data transmission circuit 100 is turned on, and the second data Q of the current bit is pulled down to 0 based on the turn-on of the N-type transistor, which keeps consistent with the first data D of the current bit.

(3) The case when the second data Q of the previous bit is 0 and the first data D of the current bit is 1.

When the enabling control signal EnB is 1, En2 is generated by the first NOR gate 201 according to the enabling control signal EnB and the second data Q of the previous bit, that is, En2 is a NOR value of 1 and 0, taking 0. En2B is generated by the first NAND gate 210 according to an inverted signal of the enabling control signal EnB and the second data Q of the previous bit, that is, En2B is a NAND value of 0 and 0, taking 1. Dp is generated by the second NAND gate 202 according to the first control signal En2 and the first data D of the current bit, that is, Dp is the NAND value of 0 and 1, taking 1. Dn is generated by the second NOR gate 220 according to the second control signal En2B and the first data D of the current bit, that is, Dn is a NOR value of 1 and 1, taking 0. It is to be learned that when the enabling control signal EnB is equal to 1, Dp=1, Dn=0, and both the P-type transistor 101 and the N-type transistor are turned off.

When the enabling control signal EnB is 0, En2 is generated by the first NOR gate 201 according to the enabling control signal EnB and the second data Q of the previous bit, that is, En2 is a NOR value of 0 and 0, taking 1. En2B is generated by the first NAND gate 210 according to an inverted signal of the enabling control signal EnB and the second data Q of the previous bit, that is, En2B is a NAND value of 1 and 0, taking 1. Dp is generated by the second NAND gate 202 according to the first control signal En2 and the first data D of the current bit, that is, Dp is the NAND value of 1 and 1, taking 0. Dn is generated by the second NOR gate 220 according to the second control signal En2B and the first data D of the current bit, that is, Dn is a NOR value of 1 and 1, taking 0. It is to be learned that when the enabling control signal EnB is equal to 0, Dp=0, Dn=0, the P-type transistor 101 is turned on, and the N-type transistor is turned off.

In conclusion, in the working condition (3), the enabling control signal EnB is 1, the P-transistor control signal Dp generated by the second NAND gate 102 remains unchanged at 1, the N-transistor control signal Dn generated by the second NOR gate 120 remains unchanged at 0, the data transmission circuit 100 is turned off, and the second data Q of the current bit remains unchanged. The enabling control signal EnB is 0, the P-transistor control signal Dp is 0, the N-transistor control signal Dn is 0, the data transmission circuit 100 is turned on, and the second data Q of the current bit is pulled up to 1 based on the turn-on of the P-type transistor, which keeps consistent with the first data D of the current bit.

(4) The case when the second data Q of the previous bit is 1 and the first data D of the current bit is 1.

When the enabling control signal EnB is 1, En2 is generated by the first NOR gate 201 according to the enabling control signal EnB and the second data Q of the previous bit, that is, En2 is a NOR value of 1 and 1, taking 0. En2B is generated by the first NAND gate 210 according to an inverted signal of the enabling control signal EnB and the second data Q of the previous bit, that is, En2B is a NAND value of 0 and 1, taking 1. Dp is generated by the second NAND gate 202 according to the first control signal En2 and the first data D of the current bit, that is, Dp is the NAND value of 0 and 1, taking 1. Dn is generated by the second NOR gate 220 according to the second control signal En2B and the first data D of the current bit, that is, Dn is a NOR value of 1 and 1, taking 0. It is to be learned that when the enabling control signal EnB is equal to 1, Dp=1, Dn=0, and both the P-type transistor 101 and the N-type transistor are turned off.

When the enabling control signal EnB is 0, En2 is generated by the first NOR gate 201 according to the enabling control signal EnB and the second data Q of the previous bit, that is, En2 is a NOR value of 0 and 1, taking 0. En2B is generated by the first NAND gate 210 according to an inverted signal of the enabling control signal EnB and the second data Q of the previous bit, that is, En2B is a NAND value of 1 and 1, taking 0. Dp is generated by the second NAND gate 202 according to the first control signal En2 and the first data D of the current bit, that is, Dp is the NAND value of 0 and 1, taking 1. Dn is generated by the second NOR gate 220 according to the second control signal En2B and the first data D of the current bit, that is, Dn is a NOR value of 0 and 1, taking 0. It is to be learned that when the enabling control signal EnB is equal to 0, Dp=1, Dn=0, and both the P-type transistor 101 and the N-type transistor are turned off.

according to the enabling control signal EnB. With reference to the discussion of Table 1, a truth table as follows is obtained.

TABLE 2

Truth Table corresponding to data of the structure for data transmission in the embodiment

| D | Q | EnB | En1 | En2 | En2B | Dp | Dn | Working condition of the data transmission circuit 100 |
|---|---|-----|-----|-----|------|----|----|--------------------------------------------------------|
| 0 | 0 | 1   | 0   | 0   | 1    | 1  | 0  | The data transmission circuit 100 is turned off and Q is kept. |
| 0 | 0 | 0   | 0   | 1   | 1    | 1  | 0  | The data transmission circuit 100 is turned off and Q is kept. |
| 0 | 1 | 1   | 1   | 0   | 1    | 1  | 0  | The data transmission circuit 100 is turned off and Q is kept. |
| 0 | 1 | 0   | 1   | 0   | 0    | 1  | 1  | The data transmission circuit 100 is turned on and Q flips. |
| 1 | 0 | 1   | 0   | 0   | 1    | 1  | 0  | The data transmission circuit 100 is turned off and Q is kept. |
| 1 | 0 | 0   | 0   | 1   | 1    | 0  | 0  | The data transmission circuit 100 is turned on and Q flips. |
| 1 | 1 | 1   | 1   | 0   | 1    | 1  | 0  | The data transmission circuit 100 is turned off and Q is kept. |
| 1 | 1 | 0   | 1   | 0   | 0    | 1  | 0  | The data transmission circuit 100 is turned off and Q is kept. |

In conclusion, in the working condition (4), regardless of whether the enabling control signal EnB is 1 or 0, the P-transistor control signal Dp generated by the second NAND gate 102 remains unchanged at 1, and the N-transistor control signal Dn generated by the second NOR gate 120 remains unchanged at 0. The data transmission circuit 100 is turned off, and the second data Q of the current bit remains unchanged, that is, the second data Q does not flip. The P-transistor control signal Dp generated by the second NAND gate 102 and the N-transistor control signal Dn generated by the second NOR gate 120 are kept unchanged, so as to avoid ineffective flipping of the control signal of a control transistor in the driver from causing the change of the working condition of the control transistor, thereby reducing the power consumption of the memory.

In some embodiments, the control circuit 200 further includes: an input sampler used for receiving the second data Q and the enabling control signal EnB and configured to employ the second data D in response to the effective level of the enabling control signal EnB to generate third data En1. Correspondingly, the first control sub-circuit 301 generates the first control signal En2 based on the third data En1, and the second control sub-circuit 302 generates the second control signal En2B based on the third data En1. Through data sampling, the value of the second data Q of the current bit is adjusted by the enabling control signal EnB, so as to improve the stability of the timing of data transmission in the memory.

Furthermore, referring to FIG. 4, the input sampler includes: a latch 300 with an input end d used for receiving the second data Q and a clock end used for receiving the enabling control signal EnB. More specifically, in an example, the clock end of the latch includes a positive clock end Lat and a negative clock end LatB. The positive clock end Lat is connected with an output end of a second inverter 320, and the negative clock end LatB and an input end of the second inverter 320 are used for receiving the enabling control signal EnB.

For the control circuit 200 with the latch 300, referring to FIGS. 5-8, the third data En1 is sampled and generated It is to be noted that the design in Table 2 takes the enabling control circuit 200 when the enabling control signal EnB is equal to 0 as an example to make detailed description, which is only for those skilled in the art to understand the implementation of the scheme, and does not constitute a limitation to the embodiment. In other embodiments, an enabling control circuit when the enabling control signal is equal to 1 may also be designed.

With reference to the contents of Table 2 and FIG. 3, it is to be learned that the structure for data transmission includes four working conditions, which are specifically as follows.

(1) The case when the second data Q of the previous bit is 0 and the first data D of the current bit is 0.

When the enabling control signal EnB is 1, the structure for data transmission is not activated, the enabling control signal EnB does not enable the latch 300, and the third data En1 remains unchanged. When the third data En1 is 0, the data refers to the contents of the second row in Table 2. At this time, Dp=1, Dn=0, both the P-type transistor 101 and the N-type transistor are turned off, and the second data Q of the current bit remains unchanged. When the third data En1 is 1, the data refers to the contents of the fourth row in Table 2. At this time, Dp=1, Dn=0, both the P-type transistor 101 and the N-type transistor are turned off, and the second data Q of the current bit remains unchanged.

Figure 5:
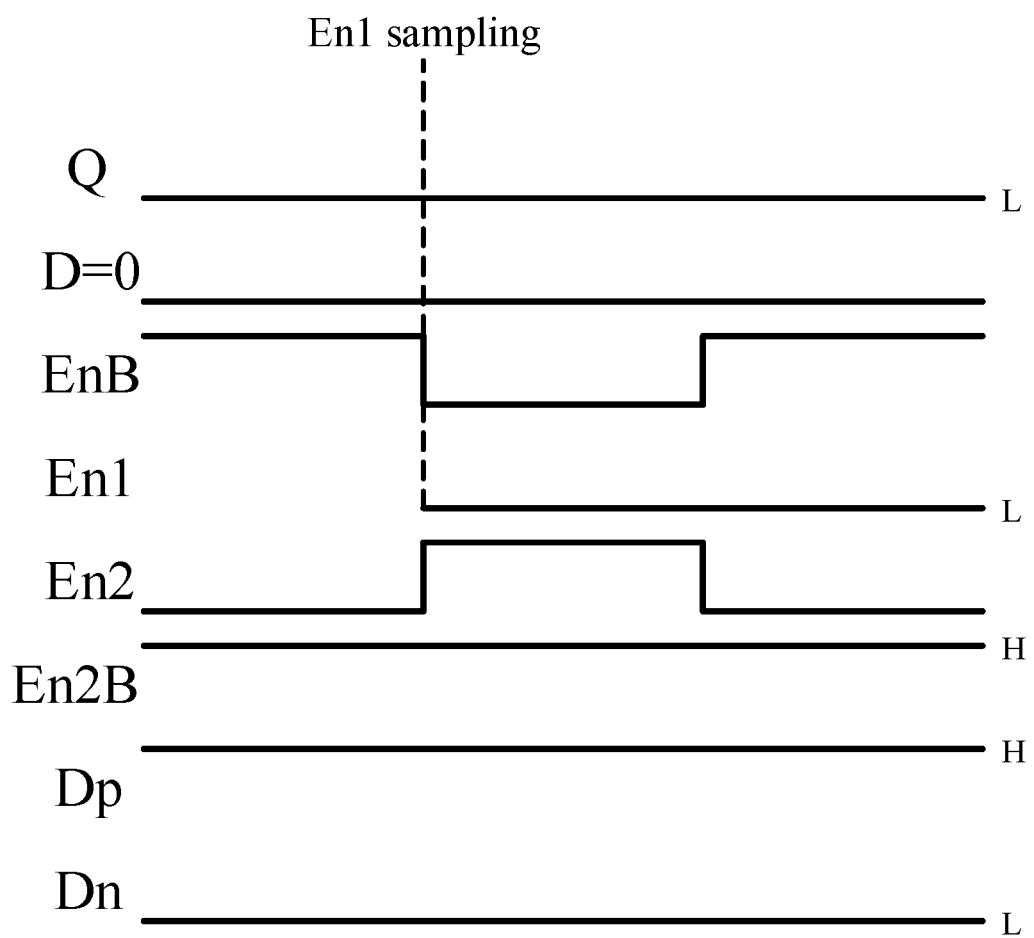
FIGS. 5-8 are schematic diagrams of signal timing change of a structure for data transmission according to an embodiment of the disclosure.

Referring to FIG. 5, when the enabling control signal EnB is 0, the structure for data transmission is activated, the enabling control signal EnB enables the latch 300, the third data En1 is generated by sampling the second data Q of the previous bit based on the latch 300 and the enabling control signal EnB, and En2 is generated by the first NOR gate 201 according to the enabling control signal EnB and the third data En1, that is, En2 is a NOR value of 0 and 0, taking 1. En2B is generated by the first NAND gate 210 according to an inverted signal of the enabling control signal EnB and the third data En1, that is, En2B is a NAND value of 1 and 0, taking 1. Dp is generated by the second NAND gate 202 according to the first control signal En2 and the first data D of the current bit, that is, Dp is the NAND value of 1 and 0, taking 1. Dn is generated by the second NOR gate 220 according to the second control signal En2B and the first data D of the current bit, that is, Dn is a NOR value of 1 and 0, taking 0. It is to be learned that when the enabling control signal EnB is equal to 0, Dp=1, Dn=0, both the P-type transistor 101 and the N-type transistor are turned off, and the second data Q of the current bit remains unchanged.

In conclusion, in the working condition (1), regardless of whether the enabling control signal EnB is 1 or 0, the P-transistor control signal Dp generated by the second NAND gate 102 remains unchanged at 1, and the N-transistor control signal Dn generated by the second NOR gate 120 remains unchanged at 0. The data transmission circuit 100 is turned off, and the second data Q of the current bit remains unchanged, that is, the second data Q does not flip. The P-transistor control signal Dp generated by the second NAND gate 102 and the N-transistor control signal Dn generated by the second NOR gate 120 are kept unchanged, so as to avoid ineffective flipping of the control signal of a control transistor in the driver from causing the change of the working condition of the control transistor, thereby reducing the power consumption of the memory.

(2) The case when the second data Q of the previous bit is 1 and the first data D of the current bit is 0.

When the enabling control signal EnB is 1, the structure for data transmission is not activated, the enabling control signal EnB does not enable the latch 300, and the third data En1 remains unchanged. When the third data En1 is 0, the data refers to the contents of the second row in Table 2. At this time, Dp=1, Dn=0, both the P-type transistor 101 and the N-type transistor are turned off, and the second data Q of the current bit remains unchanged. When the third data En1 is 1, the data refers to the contents of the fourth row in Table 2. At this time, Dp=1, Dn=0, both the P-type transistor 101 and the N-type transistor are turned off, and the second data Q of the current bit remains unchanged.

Figure 6:
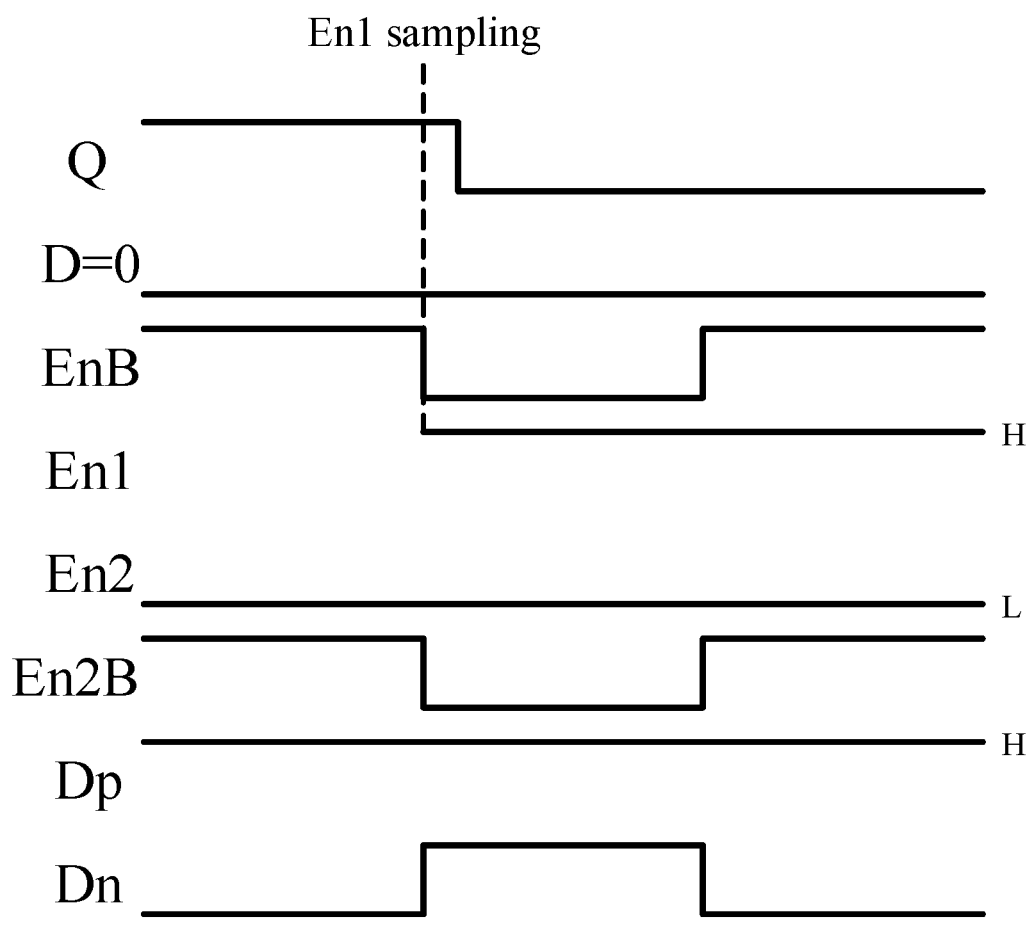

Referring to FIG. 6, when the enabling control signal EnB is 0, the structure for data transmission is activated, the enabling control signal EnB enables the latch 300, the third data En1 is generated by sampling the second data Q of the previous bit based on the latch 300 and the enabling control signal EnB, and En2 is generated by the first NOR gate 201 according to the enabling control signal EnB and the third data En1, that is, En2 is a NOR value of 0 and 1, taking 0. En2B is generated by the first NAND gate 210 according to an inverted signal of the enabling control signal EnB and the third data En1, that is, En2B is a NAND value of 1 and 1, taking 0. Dp is generated by the second NAND gate 202 according to the first control signal En2 and the first data D of the current bit, that is, Dp is the NAND value of 0 and 0, taking 1. Dn is generated by the second NOR gate 220 according to the second control signal En2B and the first data D of the current bit, that is, Dn is a NOR value of 0 and 0, taking 1. It is to be learned that when the enabling control signal EnB is equal to 0, Dp=1, Dn=1, the P-type transistor 101 is turned off, the N-type transistor is turned on, and the second data Q of the current bit is pulled down to 0.

In conclusion, in the working condition (2), the enabling control signal EnB is 1, the P-transistor control signal Dp generated by the second NAND gate 102 remains unchanged at 1, the N-transistor control signal Dn generated by the second NOR gate 120 remains unchanged at 0, the data transmission circuit 100 is turned off, and the second data Q of the current bit remains unchanged. The enabling control signal EnB is 0, the P-transistor control signal Dp is 1, the N-transistor control signal Dn is 1, the data transmission circuit 100 is turned on, and the second data Q of the current bit is pulled down to 0 based on the turn-on of the N-type transistor, which keeps consistent with the first data D of the current bit.

(3) The case when the second data Q of the previous bit is 0 and the first data D of the current bit is 1.

When the enabling control signal EnB is 1, the structure for data transmission is not activated, the enabling control signal EnB does not enable the latch 300, and the third data En1 remains unchanged. When the third data En1 is 0, the data refers to the contents of the sixth row in Table 2. At this time, Dp=1, Dn=0, both the P-type transistor 101 and the N-type transistor are turned off, and the second data Q of the current bit remains unchanged. When the third data En1 is 1, the data refers to the contents of the eighth row in Table 2. At this time, Dp=1, Dn=0, both the P-type transistor 101 and the N-type transistor are turned off, and the second data Q of the current bit remains unchanged.

Figure 7:
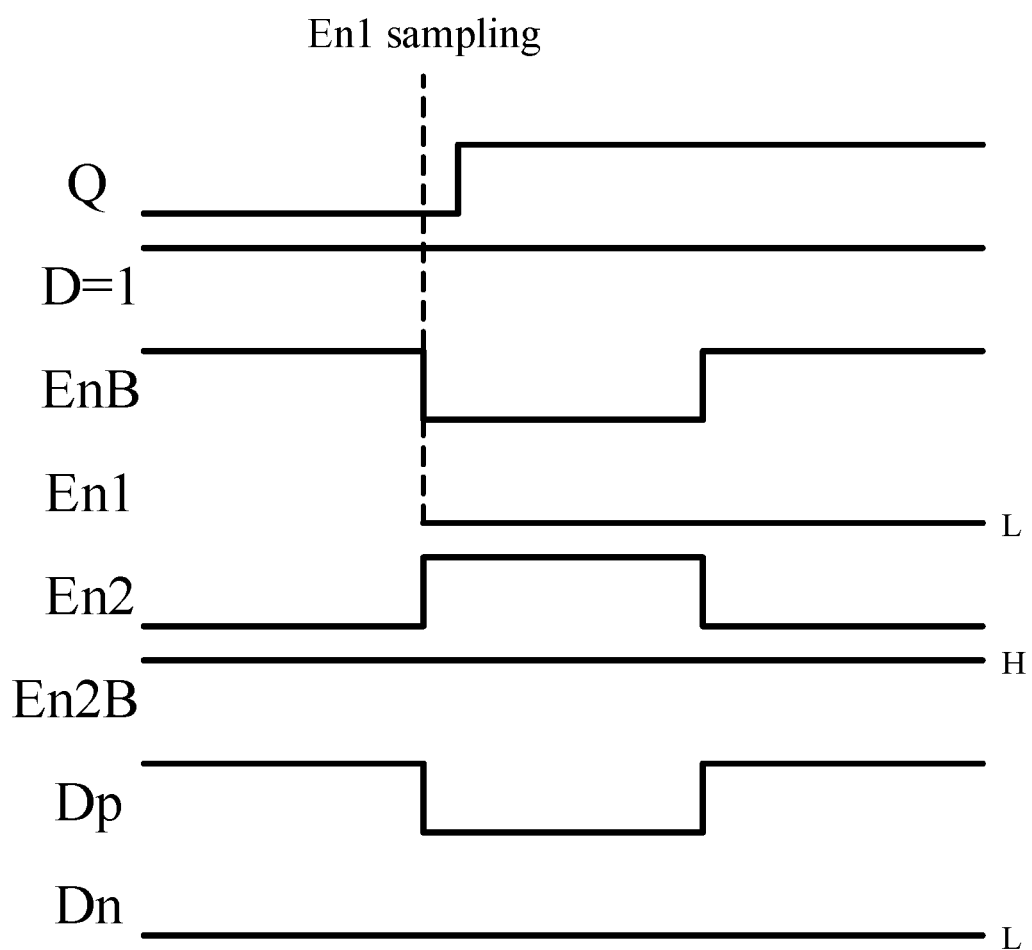

Referring to FIG. 7, when the enabling control signal EnB is 0, the structure for data transmission is activated, the enabling control signal EnB enables the latch 300, the third data En1 is generated by sampling the second data Q of the previous bit based on the latch 300 and the enabling control signal EnB, and En2 is generated by the first NOR gate 201 according to the enabling control signal EnB and the third data En1, that is, En2 is a NOR value of 0 and 0, taking 1. En2B is generated by the first NAND gate 210 according to an inverted signal of the enabling control signal EnB and the third data En1, that is, En2B is a NAND value of 1 and 0, taking 1. Dp is generated by the second NAND gate 202 according to the first control signal En2 and the first data D of the current bit, that is, Dp is the NAND value of 1 and 1, taking 0. Dn is generated by the second NOR gate 220 according to the second control signal En2B and the first data D of the current bit, that is, Dn is a NOR value of 1 and 1, taking 0. It is to be learned that when the enabling control signal EnB is equal to 0, Dp=0, Dn=0, the P-type transistor 101 is turned on, the N-type transistor is turned off, and the second data Q of the current bit is pulled up to 0.

In conclusion, in the working condition (3), the enabling control signal EnB is 1, the P-transistor control signal Dp generated by the second NAND gate 102 remains unchanged at 1, the N-transistor control signal Dn generated by the second NOR gate 120 remains unchanged at 0, the data transmission circuit 100 is turned off, and the second data Q of the current bit remains unchanged. The enabling control signal EnB is 0, the P-transistor control signal Dp is 0, the N-transistor control signal Dn is 0, the data transmission circuit 100 is turned on, and the second data Q of the current bit is pulled up to 1 based on the turn-on of the P-type transistor, which keeps consistent with the first data D of the current bit.

(4) The case when the second data Q of the previous bit is 1 and the first data D of the current bit is 1.

When the enabling control signal EnB is 1, the structure for data transmission is not activated, the enabling control signal EnB does not enable the latch 300, and the third data En1 remains unchanged. When the third data En1 is 0, the data refers to the contents of the sixth row in Table 2. At this time, Dp=1, Dn=0, both the P-type transistor 101 and the N-type transistor are turned off, and the second data Q of the current bit remains unchanged. When the third data En1 is 1, the data refers to the contents of the eighth row in Table 2. At this time, Dp=1, Dn=0, both the P-type transistor 101 and the N-type transistor are turned off, and the second data Q of the current bit remains unchanged.

Figure 8:
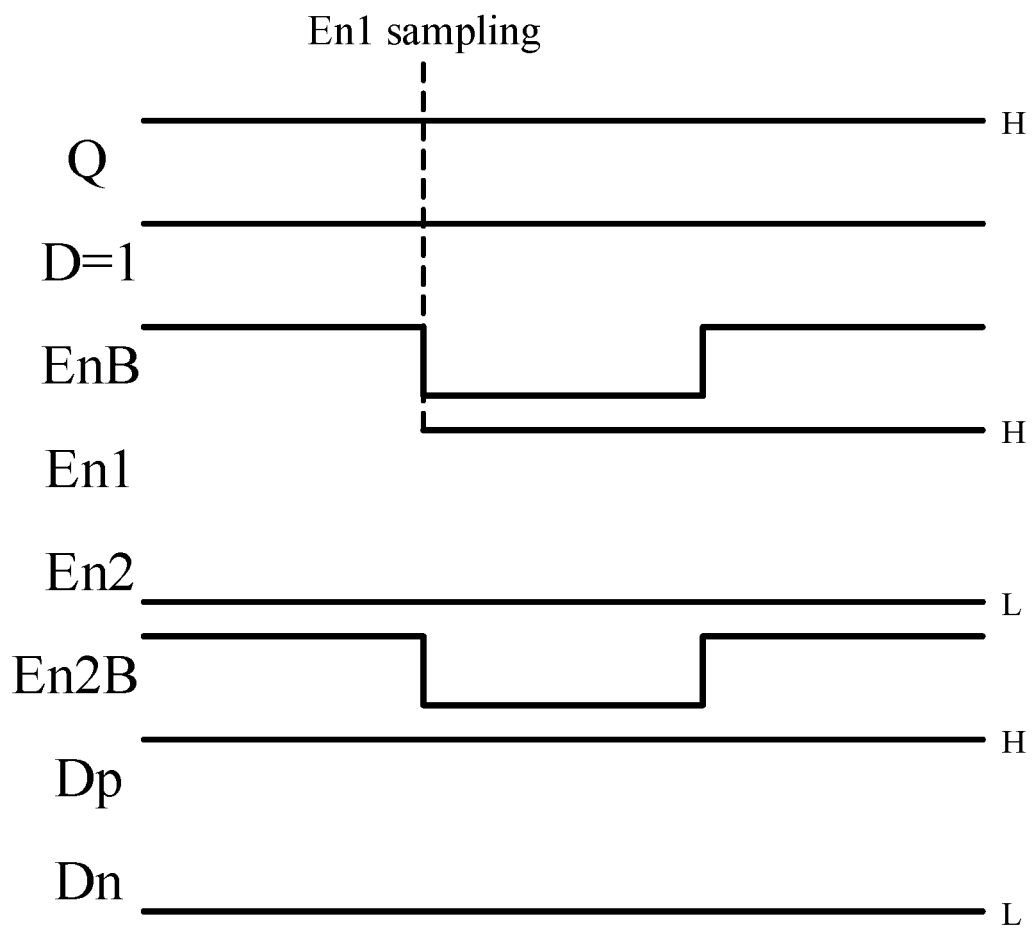

Referring to FIG. 8, when the enabling control signal EnB is 0, the structure for data transmission is activated, the enabling control signal EnB enables the latch 300, the third data En1 is generated by sampling the second data Q of the previous bit based on the latch 300 and the enabling control signal EnB, and En2 is generated by the first NOR gate 201 according to the enabling control signal EnB and the third data En1, that is, En2 is a NOR value of 0 and 1, taking 0. En2B is generated by the first NAND gate 210 according to an inverted signal of the enabling control signal EnB and the third data En1, that is, En2B is a NAND value of 1 and 1, taking 0. Dp is generated by the second NAND gate 202 according to the first control signal En2 and the first data D of the current bit, that is, Dp is the NAND value of 0 and 1, taking 1. Dn is generated by the second NOR gate 220 according to the second control signal En2B and the first data D of the current bit, that is, Dn is a NOR value of 0 and 1, taking 0. It is to be learned that when the enabling control signal EnB is equal to 0, Dp=1, Dn=0, both the P-type transistor 101 and the N-type transistor are turned off.

In conclusion, in the working condition (4), regardless of whether the enabling control signal EnB is 1 or 0, the P-transistor control signal Dp generated by the second NAND gate 102 remains unchanged at 1, and the N-transistor control signal Dn generated by the second NOR gate 120 remains unchanged at 0. The data transmission circuit 100 is turned off, and the second data Q of the current bit remains unchanged, that is, the second data Q does not flip. The P-transistor control signal Dp generated by the second NAND gate 102 and the N-transistor control signal Dn generated by the second NOR gate 120 are kept unchanged, so as to avoid ineffective flipping of the control signal of a control transistor in the driver from causing the change of the working condition of the control transistor, thereby reducing the power consumption of the memory.

According to the structure for data transmission provided in the embodiment, the flip control signal is generated based on the second data Q. That is, the flip control signal contains information of the second data Q of the previous bit. The data transmission circuit 100 controls the turn-on or turn-off based on the flip control signal and the first data D of the current bit, which is equivalent to adding a process of judging whether the first data D of the current bit is the same as the second data Q of previous bit. When the first data D of the current bit is the same as the second data Q of the previous bit, the data transmission circuit 100 is directly turned off, that is, the driver in the bus is turned off, so as to avoid the control signal of a control transistor in the driver from ineffective flipping, and accordingly avoid ineffective current consumption in the memory so as to reduce the power consumption of the memory.

It is to be noted that the characteristics disclosed in the structure for data transmission provided in the present disclosure may be arbitrarily combined without conflict to obtain a new data transmission structure embodiment.

Figure 9:
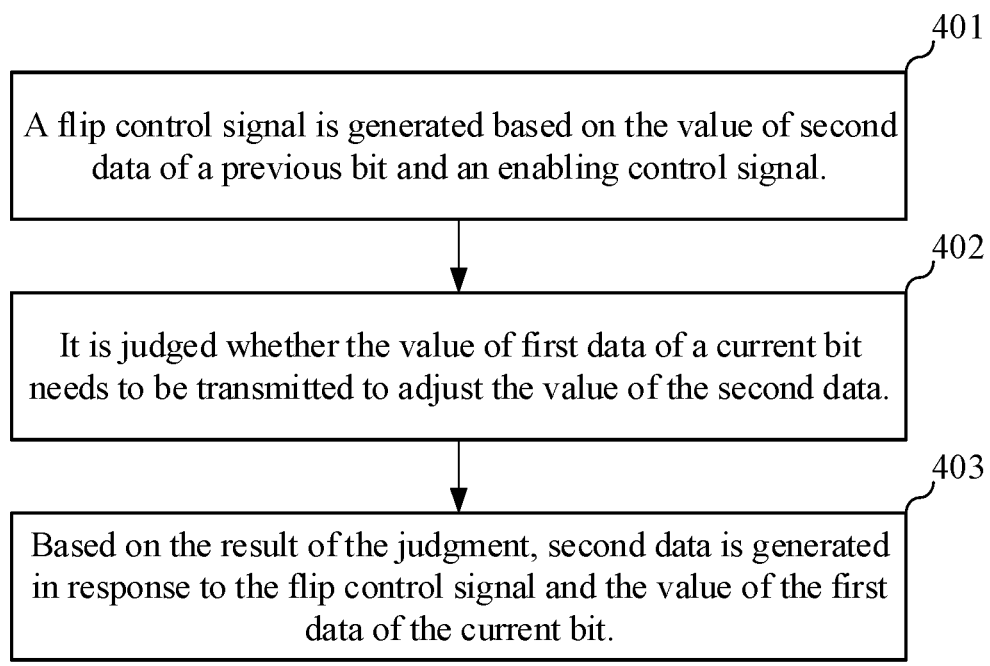
FIG. 9 is a flowchart of corresponding steps of a method for data transmission according to another embodiment of the disclosure.

Another embodiment of the disclosure provides a method for data transmission, which is applied to the structure for data transmission provided in the above embodiment, so as to avoid the control signal of a control transistor in the driver from ineffective flipping, and accordingly avoid ineffective current consumption in the memory so as to reduce the power consumption of the memory. FIG. 9 is a flowchart of corresponding steps of a method for data transmission according to an embodiment. The method for data transmission provided by the embodiment is described in detail below with reference to the drawing, and the part corresponding to the above embodiment will not be described in detail in the embodiment. The detail is as follows.

Referring to FIG. 9, the method for data transmission includes the following operations.

At S401, a flip control signal is generated based on the value of second data of a previous bit and an enabling control signal.

At S402, it is judged whether the value of first data of a current bit needs to be transmitted to adjust the value of the second data.

Specifically, based on the value of the second data of the previous bit and the value of the first data of the current bit, it is judged whether the value of the first data of the current bit needs to be transmitted to adjust the value of the second data.

More specifically, if the value of the second data of the previous bit is different from the value of the first data of the current bit, the result of the judgment indicates the transmission of the value of the first data of the current bit to generate the value of the second data of the current bit. If the value of the second data of the previous bit is the same as the value of the first data of the current bit, the result of the judgment is used for indicating direct generation of the value of the second data of the current bit based on the value of the second data of previous bit.

At S403, based on the result of the judgment, second data is generated in response to the flip control signal and the value of the first data of the current bit.

The flip control signal is generated based on the second data of the previous bit, that is, the flip control signal contains the information of the second data of the previous bit. Based on the flip control signal and the value of the first data of the current bit, that is, according to the value of the second data of the previous bit and the value of the first data of the current bit, it is judged whether the value of the first data of the current bit needs to be transmitted to adjust the value of the second data, and then the second data is generated based on the result of the judgment. By adding a judgment flow in the data transmission process, the ineffective flipping of the control signal of the control transistor in the driver is avoided. Accordingly, ineffective current consumption in the memory is avoided so as to reduce the power consumption of the memory.

In some embodiments, S401 further includes that: in response to the effective level of the enabling control signal, the second data is sampled to generate third data, and the flip control signal is generated based on the third data.

Furthermore, in some embodiments, S401 includes that: the value of the second data is sampled based on the enabling control signal to generate the third data. The flip control signal includes a first control signal and a second control signal. The operation of generating the flip control signal based on the value of the third data includes that: the first control signal is generated based on the third data and the enabling control signal, and the second control signal is generated based on the third data and an inverted signal of the enabling control signal.

In some embodiments, S403 includes that: a pull-up control signal is generated based on the value of the first data of the current bit and the first control signal, the pull-up control signal being used for pulling up the value of the second data; and a pull-down control signal is generated based on the value of the second data of the current bit and the second control signal, the pull-down control signal being used for pulling down the value of the second data.

Specifically, if the pull-up control signal is effective and the pull-down control signal is ineffective, the value of the second data is pulled up. If the pull-up control signal is ineffective and the pull-down control signal is effective, the value of the second data is pulled down. If both the pull-up control signal and the pull-down control signal are ineffective, the value of the second data of the current bit is directly generated based on the value of the second data of the previous bit.

It is to be noted that the characteristics disclosed in the method for data transmission provided in the present disclosure may be arbitrarily combined without conflict to obtain a new data transmission method embodiment.

Yet another embodiment of the disclosure provides a memory, which employs the structure for data transmission provided in the above embodiment for data transmission, so as to prevent a control signal of a control transistor in a driver from ineffective flipping, thereby avoiding ineffective current consumption in the memory and reducing the power consumption of the memory.

Specifically, the memory may be a memory unit or apparatus based on a semiconductor apparatus or component. For example, the memory apparatus may be a volatile memory, such as a Dynamic Random Access Memory (DRAM), a Synchronous DRAM (SDRAM), a Double Data Rate SDRAM (DDR SDRAM), a Low Power DDR SDRAM (LPDDR SDRAM), a Graphics DDR SDRAM (GDDR SDRAM), a Double Data Rate Two SDRAM (DDR2 SDRAM), a Double Data Rate Three SDRAM (DDR3 SDRAM), a Double Data Rate Fourth Generation SDRAM (DDR4 SDRAM), and a Thyristor Random Access Memory (TRAM). Or same may be a nonvolatile memory, such as Phase Change RAM (PRAM), a Magnetic RAM (MRAM) and a Resistive RAM (RRAM).

Those skilled in the art may understand that the above embodiments are specific embodiments to implement the disclosure. However, in practice, various variations may be made in form and details without departing from the spirit and scope of the disclosure.

The invention claimed is:

1. A structure for data transmission, comprising:
a data transmission circuit used for receiving first data and a flip control signal, and configured to generate second data in response to the flip control signal and the first data; and
a control circuit used for receiving the second data and an enabling control signal, and configured to generate the flip control signal in response to the enabling control signal and the second data,
wherein the enabling control signal is used for enabling the data transmission circuit to transmit data,
when the second data of a previous bit is the same as the first data of a current bit, the flip control signal and the first data are used for turning off the data transmission circuit, and the second data of the current bit is generated according to the second data of the previous bit,
when the second data of the previous bit is different from the first data of the current bit, the flip control signal and the first data are used for turning on the data transmission circuit, and the second data of the current bit being generated according to the first data of the current bit;
the flip control signal comprising a first control signal and a second control signal,
wherein the control circuit comprises:
a first control sub-circuit configured to generate the first control signal based on the second data and the enabling control signal, and
a second control sub-circuit configured to generate the second control signal based on the second data and the enabling control signal,
wherein when the enabling control signal is an effective signal, the generated first control signal and the generated second control signal are mutually inverted signals.

2. The structure for data transmission of claim 1, wherein the first control sub-circuit comprises: a first NOR gate with an input end used for receiving the second data, the other input end used for receiving the enabling control signal, and an output end used for outputting the first control signal.

3. The structure for data transmission of claim 1, wherein the second control sub-circuit comprises: a first NAND gate with an input end used for receiving the second data, the other input end connected to an output end of a first inverter, and an output end used for outputting the second control signal, wherein an input end of the first inverter is used for receiving the enabling control signal.

4. The structure for data transmission of claim 1, wherein the data transmission circuit comprises:
a second NAND gate with an input end used for receiving the first data and the other input end used for receiving the first control signal;
a second NOR gate with an input end used for receiving the first data and the other input end for receiving the second control signal;
a P-type transistor with a gate connected to an output end of the second NAND gate, a source coupled with a power supply voltage, and a drain used for outputting the second data; and
an N-type transistor with a gate connected to an output end of the second NOR gate, a source grounded, and a drain connected to the drain of the P-type transistor.

5. The structure for data transmission of claim 1, wherein the control circuit further comprises:
an input sampler used for receiving the second data and the enabling control signal, and configured to sample the second data in response to an effective level of the enabling control signal to generate third data,
wherein the first control sub-circuit generates the first control signal based on the third data, and the second control sub-circuit generates the second control signal based on the third data.

6. The structure for data transmission of claim 5, wherein the input sampler comprises a latch with an input end used for receiving the second data and a clock end used for receiving the enabling control signal.

7. The structure for data transmission of claim 6, wherein the clock end of the latch comprises a positive clock end and a negative clock end, the positive clock end is connected to an output end of a second inverter, and the negative clock end and an input end of the second inverter are used for receiving the enabling control signal.

8. A method for data transmission, applied to a structure for data transmission, comprising:
generating a flip control signal based on a value of second data of a previous bit and an enabling control signal;
judging whether a value of first data of a current bit needs to be transmitted to adjust the value of the second data based on the value of the second data of the previous bit and the value of the first data of the current bit; and
generating, based on the result of the judgment, the second data in response to the flip control signal and the value of the first data of the current bit;
wherein the generating a flip control signal based on a value of the second data of a previous bit and an enabling control signal comprises: in response to an effective level of the enabling control signal, sampling the second data to generate third data, and generating the flip control signal based on a value of the third data; the method further comprising:
sampling the value of the second data based on the enabling control signal to generate the third data,
wherein the flip control signal comprises a first control signal and a second control signal, wherein generating the flip control signal based on the value of the third data comprises:
generating the first control signal based on the third data and the enabling control signal, and generating the second control signal based on the third data and an inverted signal of the enabling control signal.

9. The method for data transmission of claim 8, wherein judging whether the value of first data of a current bit needs to be transmitted to adjust the value of the second data comprises:
when the value of the second data of the previous bit is different from the value of the first data of the current bit, a result of the judgment is used for indicating the transmission of the value of the first data of the current bit to generate the value of the second data of the current bit; and
when the value of the second data of the previous bit is the same as the value of the first data of the current bit, the result of the judgment is used for indicating direct generation of the value of the second data of the current bit based on the value of the second data of a previous bit.

10. The method for data transmission of claim 8, wherein generating the second data in response to the flip control signal and the value of the first data of the current bit comprises:
generating a pull-up control signal based on the value of the first data of the current bit and the first control signal, the pull-up control signal being used for pulling up the value of the second data; and
generating a pull-down control signal based on the value of the second data of the current bit and the second control signal, the pull-down control signal being used for pulling down the value of the second data.

11. The method for data transmission of claim 10, comprising:
pulling up the value of the second data when the pull-up control signal is effective and the pull-down control signal is ineffective;
pulling down the value of the second data when the pull-up control signal is ineffective and the pull-down control signal is effective; and
directly generating the value of the second data of the current bit based on the value of the second data of the previous bit when both the pull-up control signal and the pull-down control signal are ineffective.

12. A memory, employing a structure for data transmission comprising:
a data transmission circuit used for receiving first data and a flip control signal, and configured to generate second data in response to the flip control signal and the first data; and
a control circuit used for receiving the second data and an enabling control signal, and configured to generate the flip control signal in response to the enabling control signal and the second data,
wherein the enabling control signal is used for enabling the data transmission circuit to transmit data,
when the second data of a previous bit is the same as the first data of a current bit, the flip control signal and the first data are used for turning off the data transmission circuit, and the second data of the current bit is generated according to the second data of the previous bit,
when the second data of the previous bit is different from the first data of the current bit, the flip control signal and the first data are used for turning on the data transmission circuit, and the second data of the current bit being generated according to the first data of the current bit;
wherein the structure for data transmission further comprises:
the flip control signal comprising a first control signal and a second control signal,
wherein the control circuit comprises:
a first control sub-circuit configured to generate the first control signal based on the second data and the enabling control signal, and
a second control sub-circuit configured to generate the second control signal based on the second data and the enabling control signal,
wherein when the enabling control signal is an effective signal, the generated first control signal and the generated second control signal are mutually inverted signals.

13. The memory of claim 12, wherein the first control sub-circuit comprises: a first NOR gate with an input end used for receiving the second data, the other input end used for receiving the enabling control signal, and an output end used for outputting the first control signal.

14. The memory of claim 12, wherein the second control sub-circuit comprises: a first NAND gate with an input end used for receiving the second data, the other input end connected to an output end of a first inverter, and an output end used for outputting the second control signal, wherein an input end of the first inverter is used for receiving the enabling control signal.

15. The memory of claim 12, wherein the data transmission circuit comprises:
a second NAND gate with an input end used for receiving the first data and the other input end used for receiving the first control signal;
a second NOR gate with an input end used for receiving the first data and the other input end for receiving the second control signal;
a P-type transistor with a gate connected to an output end of the second NAND gate, a source coupled with a power supply voltage, and a drain used for outputting the second data; and
an N-type transistor with a gate connected to an output end of the second NOR gate, a source grounded, and a drain connected to the drain of the P-type transistor.

16. The memory of claim 12, wherein the control circuit further comprises:
an input sampler used for receiving the second data and the enabling control signal, and configured to sample the second data in response to an effective level of the enabling control signal to generate third data,
wherein the first control sub-circuit generates the first control signal based on the third data, and the second control sub-circuit generates the second control signal based on the third data.

* * * * *